(12) United States Patent
Chiang

(10) Patent No.: US 11,848,210 B2
(45) Date of Patent: Dec. 19, 2023

(54) SEMICONDUCTOR STRUCTURE AND METHOD OF FORMING THE SAME

(71) Applicant: Winbond Electronics Corp., Taichung (TW)

(72) Inventor: Chih-Yu Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 181 days.

(21) Appl. No.: 17/567,307

(22) Filed: Jan. 3, 2022

(65) Prior Publication Data
US 2023/0230837 A1    Jul. 20, 2023

(51) Int. Cl.
*H01L 23/544* (2006.01)
*H01L 21/033* (2006.01)
*H10B 12/00* (2023.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 23/544* (2013.01); *H01L 2223/54426* (2013.01); *H10B 12/00* (2023.02)

(58) Field of Classification Search
CPC ............. H01L 21/0332; H01L 21/0335; H01L 21/0337; H01L 21/0338; H01L 23/544
See application file for complete search history.

(56) References Cited

U.S. PATENT DOCUMENTS

| | | | |
|---|---|---|---|
| 1,037,391 A | 9/1912 | Wise | |
| 6,778,275 B2 | 8/2004 | Bowes | |
| 8,513,821 B2 | 8/2013 | Yao et al. | |
| 10,635,007 B1 * | 4/2020 | Yang | H01L 21/0337 |

\* cited by examiner

*Primary Examiner* — Walter H Swanson
(74) *Attorney, Agent, or Firm* — Birch, Stewart, Kolasch & Birch, LLP

(57) ABSTRACT

A semiconductor structure includes: a plurality of calibration reference features disposed on a substrate and spaced apart from each other in a first direction; and a plurality of columns of first active features and a plurality of columns of second active features respectively disposed on opposite sides of the calibration reference features, wherein each of the columns of first active features is spaced apart from each other in a second direction, each of the columns of second active features is spaced apart from each other in the second direction, and the calibration reference features, the first active features, and the second active features are disposed on the same layer and are a portion of the substrate.

20 Claims, 10 Drawing Sheets

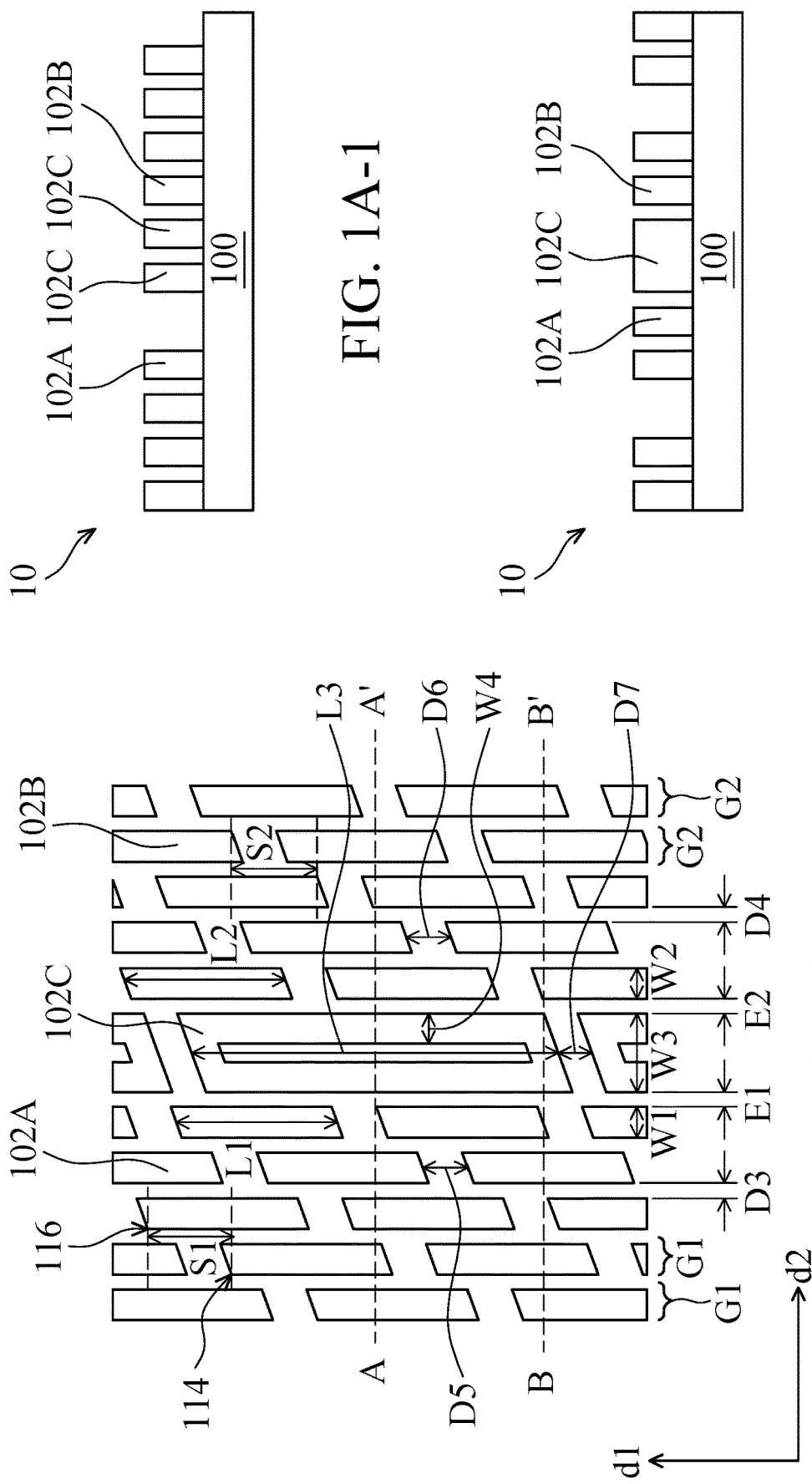

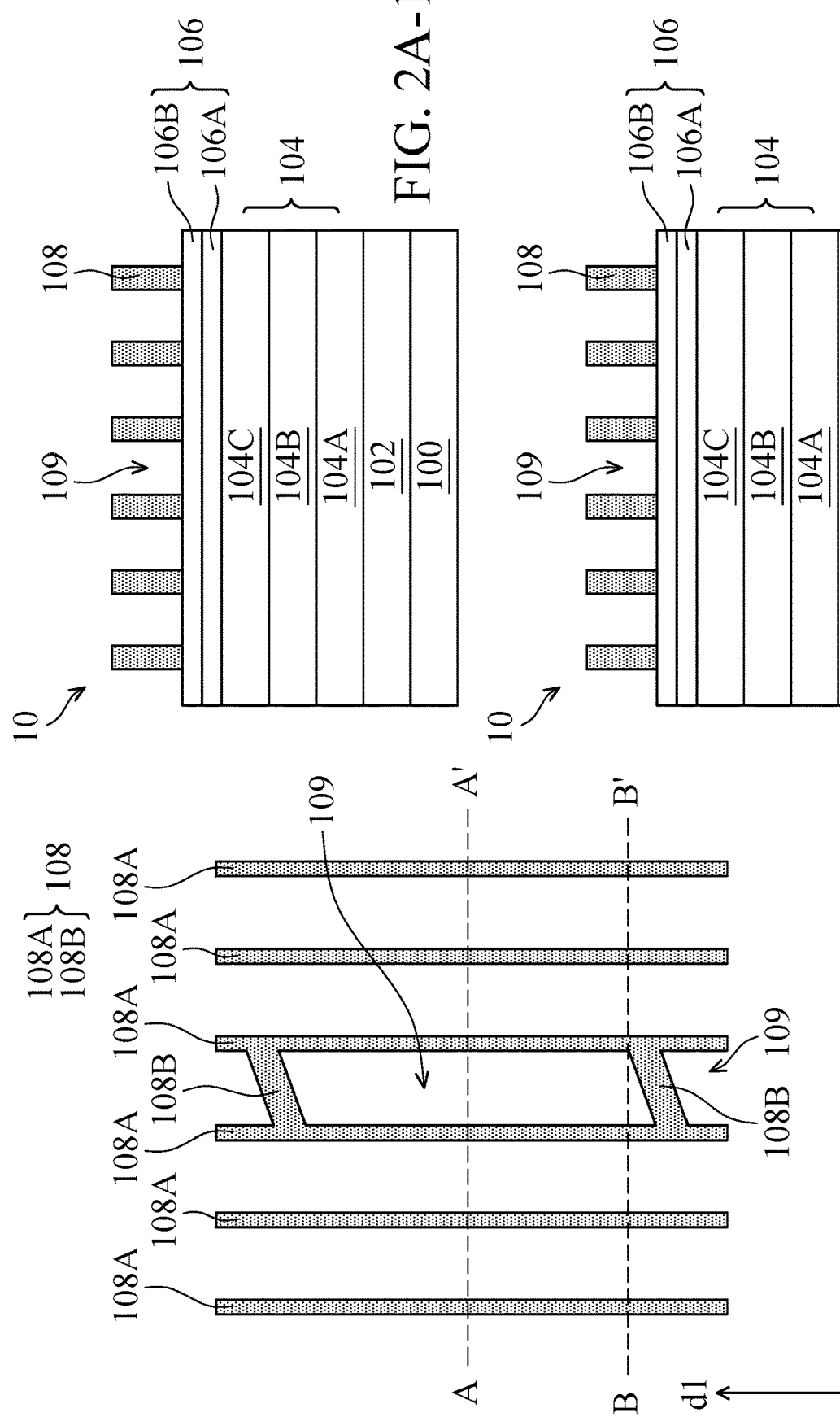

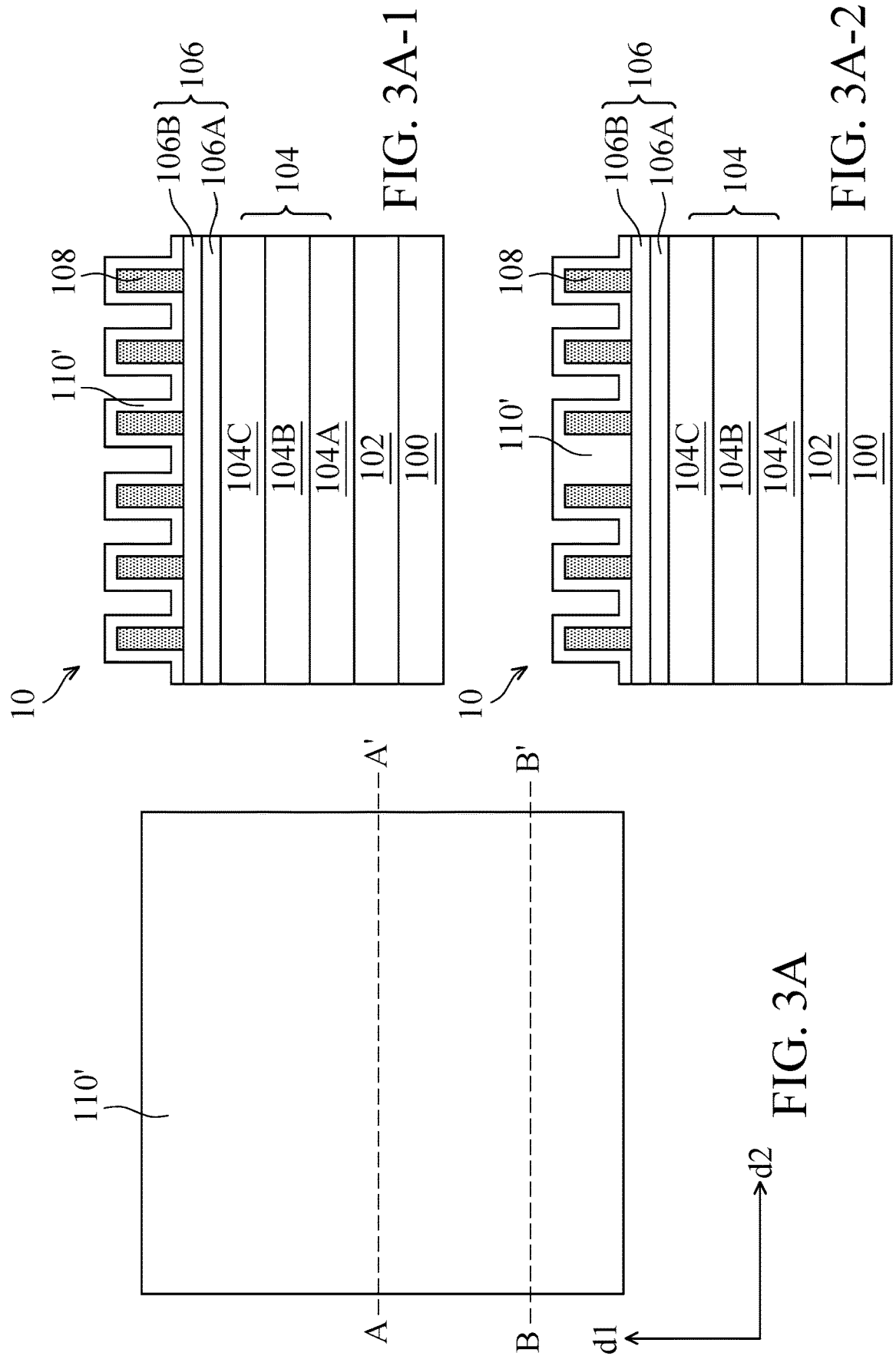

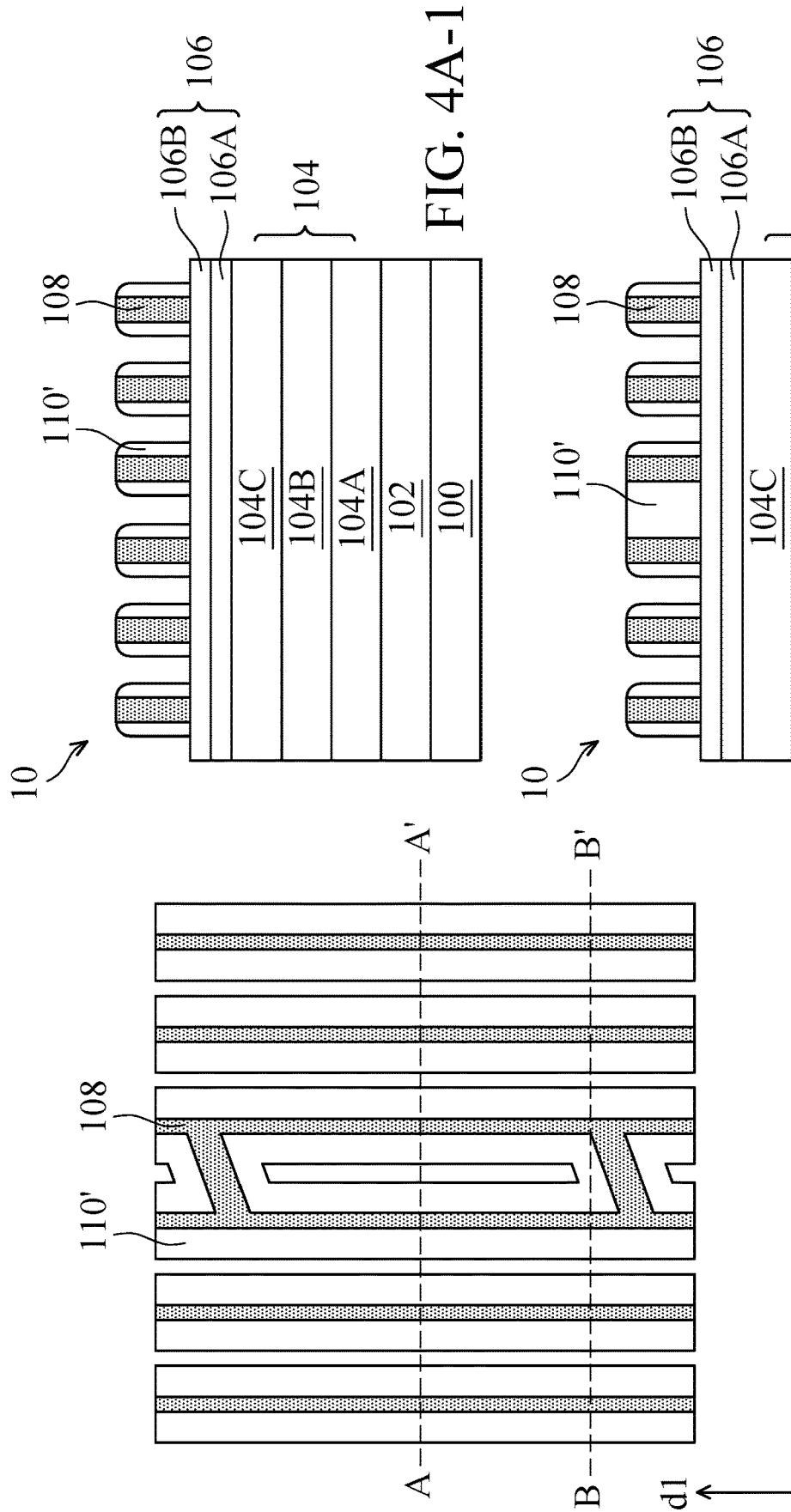

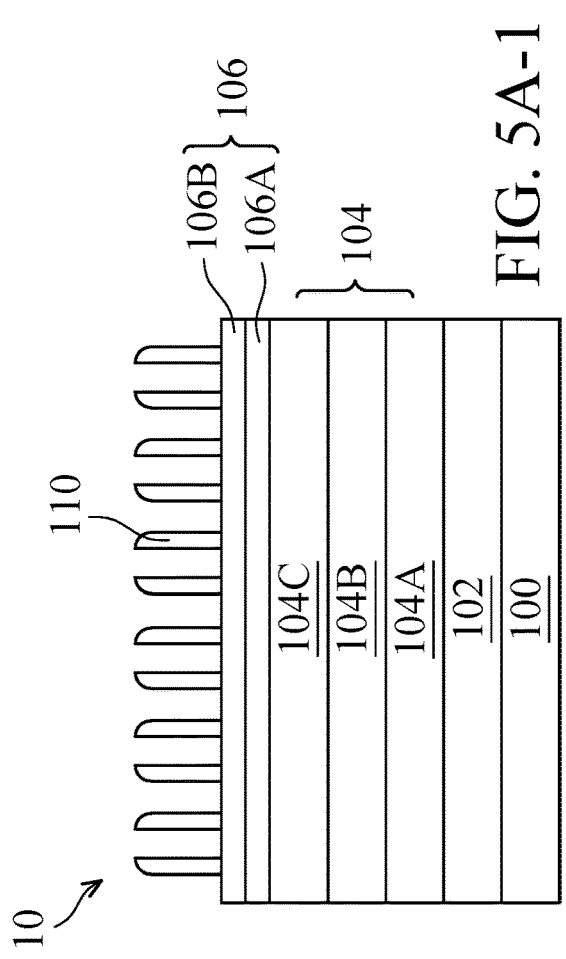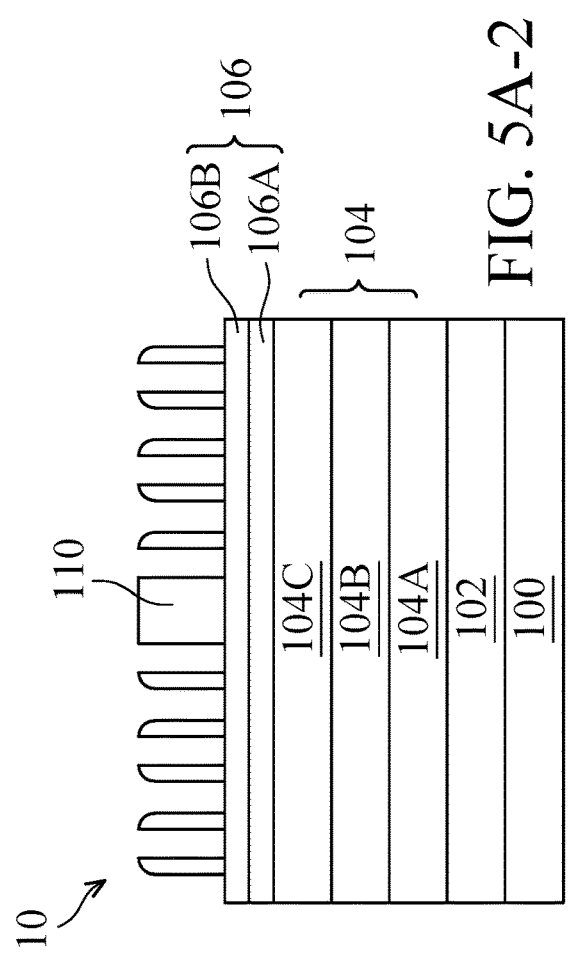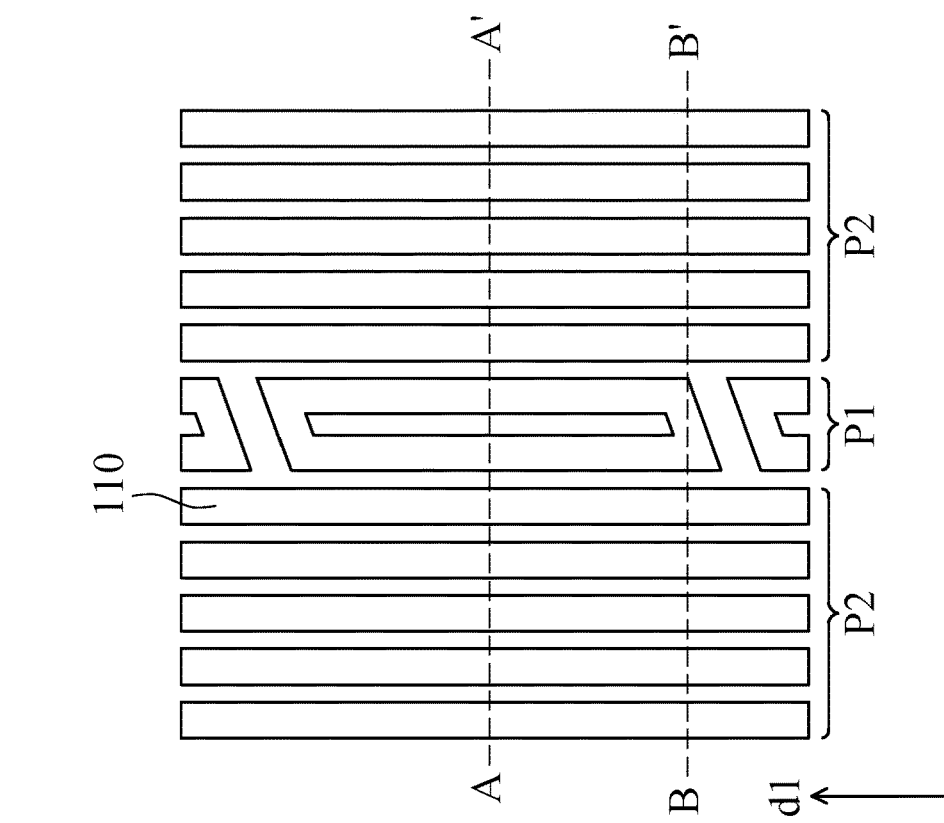

SEMICONDUCTOR STRUCTURE AND METHOD OF FORMING THE SAME

BACKGROUND

Technical Field

The present disclosure relates to a semiconductor structure, and in particular to a semiconductor structure with calibration reference features and a method for manufacturing the same.

Description of the Related Art

In the process for manufacturing semiconductor devices (e.g., memory devices or transistor devices), various patterning processes (including lithography processes and etching processes, etc.) are generally used to transfer the feature pattern in the structure, so as to form the desired semiconductor structure. However, many challenges arise when the size of the device keeps scaling down. For example, offsets or deviations may exist between various patterning processes that may adversely affect the semiconductor structure, thereby reducing the reliability or performance of the device.

BRIEF SUMMARY

The present disclosure provides a semiconductor structure, including a plurality of calibration reference features disposed on a substrate and spaced apart from each other in a first direction; and a plurality of columns of first active features and a plurality of columns of second active features respectively disposed on opposite sides of the calibration reference features, wherein each of the columns of first active features is spaced apart from each other in a second direction, and each of the columns of first active features includes a plurality of first active features spaced apart from each other in the first direction, wherein the first direction is not parallel to the second direction, each of the columns of second active features is spaced apart from each other in the second direction, and each of the columns of second active features includes a plurality of second active features spaced apart from each other in the first direction, and the calibration reference features, the first active features, and the second active features are disposed on the same layer and are a portion of the substrate, wherein the width of the calibration reference features is greater than the width of the first active features and is greater than the width of the second active features, the length of the calibration reference features is greater than the length of the first active features and is greater than the length of the second active features.

The present disclosure provides a method for forming a semiconductor structure, including providing a substrate with an active layer thereon, wherein the active layer is a portion of the substrate; forming a mask layer stack on the active layer; forming a sacrificial layer on the mask layer stack; forming a patterned spacer on the sacrificial layer, the patterned spacer comprising a calibration reference pattern and an active region pre-pattern; performing a first patterning process to transfer the calibration reference pattern and the active region pre-pattern of the patterned spacer to the mask layer stack; after performing the first patterning process, performing a second patterning process to pattern the mask layer stack with the active region pre-pattern into an active region pattern; and after performing the second patterning process, performing a third patterning process to transfer the calibration reference pattern and the active region pattern of the mask layer stack to the active layer to respectively form a plurality of calibration reference features and a plurality of columns of active features.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9, and 10 illustrate top views of a semiconductor structure according to some embodiments of the present disclosure.

FIGS. 1A-1, 2A-1, 3A-1, 4A-1, 5A-1, 6A-1, 7A-1, and 8A-1 illustrate cross-sectional views of a semiconductor structure respectively along the line A-A' of FIGS. 1A, 2A, 3A, 4A, 5A, 6A, 7A, and 8A according to some embodiments of the present disclosure.

FIGS. 1A-2, 2A-2, 3A-2, 4A-2, 5A-2, 6A-2, 7A-2, and 8A-2 illustrate cross-sectional views of a semiconductor structure respectively along the line B-B' of FIGS. 1A, 2A, 3A, 4A, 5A, 6A, 7A, and 8A according to some embodiments of the present disclosure.

DETAILED DESCRIPTION

Figures 1, 6A:
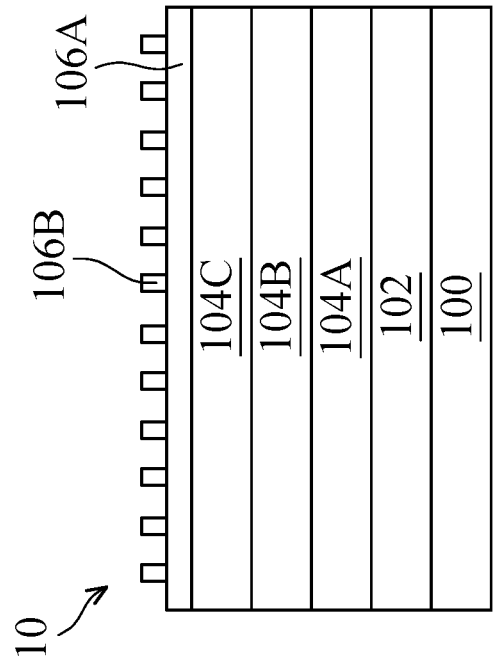
Figures 2, 6A:
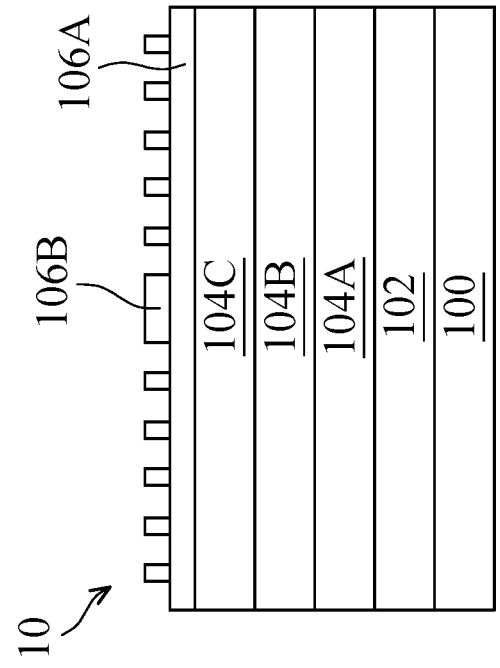
Figure 6A:
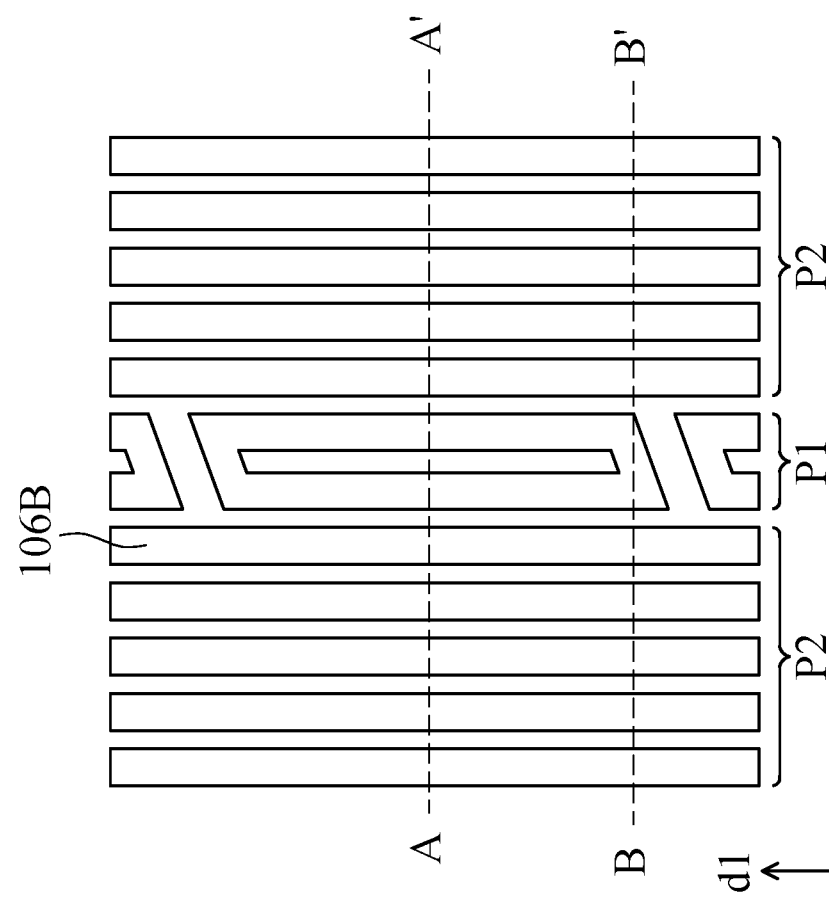

FIG. 1A illustrates a top view of the semiconductor structure 10, and FIGS. 1A-1 and 1A-2 illustrate cross-sectional views of the semiconductor structure 10 along lines A-A' and B-B' of FIG. 1A, respectively. For the sake of simplicity, FIG. 1A only shows the top view of a plurality of columns of first active features G1, a plurality of columns of second active features G2, and a plurality of calibration reference features 102C. The semiconductor structure 10 includes a substrate 100, a plurality of columns of first active features G1, a plurality of columns of second active features G2, and a plurality of calibration reference features 102C.

Referring to FIG. 1A, a plurality of calibration reference features 102C are on the substrate 100, and the calibration reference features 102C are spaced apart from each other in a first direction d1. In some embodiments, the calibration reference features 102C have a ring shape. In some embodiments, the width W4 of one side of the ring shape may be equal to the width W1 of a first active feature 102A and equal to the width W2 of a second active feature 102B. A plurality of columns of first active features G1 and a plurality of columns of second active features G2 are disposed on opposite sides of the calibration reference features 102C, respectively. Each of the columns of first active features G1 is spaced apart from each other in a second direction d2, and each of the columns of first active features G1 includes a plurality of first active features 102A spaced apart from each other in the first direction d1. In some embodiments, the first direction d1 is not parallel to the second direction d2. Each of the columns of second active features G2 is spaced apart from each other in the second direction d2, and each of the columns of second active features G2 includes a plurality of second active features 102B spaced apart from each other in the first direction d1. Referring to FIGS. 1A-1 and 1A-2, the calibration reference features 102C, the first active features 102A, and the second active features 102B are disposed on the same layer. In some embodiments, the first active features 102A, the second active features 102B, and the calibration reference features 102C may include the same material. For example, the first active features 102A, the second active features 102B, and the calibration reference features 102C are a portion of the substrate, wherein the first active features 102A, the second active features 102B, and the calibration reference features 102C are formed by patterning the substrate 100. Thus, the first active features 102A, the second active features 102B, the calibration reference features 102C, and the substrate 100 are continuous and are formed by the same material.

The calibration reference features 102C may be used to measure the offsets between different processes to improve the reliability and/or process margins of the device. For example, the pattern of the calibration reference features 102C and the active features (e.g., the first active features 102A and the second active features 102B) are formed in different patterning processes, respectively. Therefore, by measuring the offsets of the pattern of the calibration reference features 102C and the active features (e.g., the first active features 102A and the second active features 102B), it is possible to determine whether there are any offsets between the patterning process for forming the active features and the patterning process for forming the calibration reference features 102C. Thereafter, based on the measured offsets, the parameters of the patterning process for the next batch of semiconductor structures may be optimized or the parameters of the subsequent process may be adjusted, thereby improving the reliability and/or process margins of the device. In some embodiments, the calibration reference features 102C and the active features (e.g., the first active features 102A and the second active features 102B) may be integrated into an alignment marks region of the semiconductor device or disposed in the memory array region, such that the patterns of the active features (e.g., the first active features 102A and the second active features 102B) are formed in the same process as the active region of the semiconductor device, and are formed in a different process from the pattern of the calibration reference features 102C. In some embodiments, by measuring the offsets of the calibration reference features 102C and the active features (e.g., the first active features 102A and the second active features 102B), it is possible to determine whether there are any offsets in the active region of the semiconductor device, and to optimize the process parameters for forming the active region of the semiconductor device or adjust the subsequent process parameters based on the measured offsets. In some embodiments of the present disclosure, the semiconductor device is a dynamic random access memory (DRAM).

In some embodiments, the width W3 of the calibration reference features 102C is greater than the width W1 of the first active features 102A and is greater than the width W2 of the second active features 102B, the length L3 of the calibration reference features 102C is greater than the length L1 of the first active features 102A and is greater than the length L2 of the second active features 102B. In some embodiments, the width W3 of the calibration reference features 102C is at least twice the width W1 of the first active features 102A and at least twice the width W2 of the second active features 102B, and the length L3 of the calibration reference features 102C is at least twice the length L1 of the first active features 102A and at least twice the length L2 of the second active features 102B, i.e., $W3 \geq 2*W1$, $W3 \geq 2*W2$, $L3 \geq 2*L1$, and $L3 \geq 2*L2$.

In some embodiments, two adjacent columns of the first active features 102A are disposed alternating with each other and two adjacent columns of the second active features 102B are disposed alternating with each other. For example, the two adjacent columns of the first active features 102A have a first offset distance S1 in the first direction d1 and the two adjacent columns of the second active features 102B have a second offset distance S2 in the first direction d1. The offset distance herein is defined as the distance between the corresponding positions of the two adjacent columns of the active features in the first direction d1, such as the distance S1 between the corresponding positions of the two adjacent columns of the first active features 102A in the first direction d1 as indicated by arrows 114 and 116 in FIG. 1A. In some embodiments, the first offset distance S1 may be equal to the second offset distance S2.

In some embodiments, the longitudinal lengths of the calibration reference features 102C, the first active features 102A, and the second active features 102B are all along the first direction d1. For example, the length L3 of the calibration reference features 102C, the length L1 of the first active features 102A, and the length L2 of the second active features 102B are all along the first direction d1 and parallel to each other.

In some embodiments, outer contours of the calibration reference features 102C, the first active features 102A, and the second active features 102B have the same or similar shape, enabling faster or more accurate measurement of the offsets between the calibration reference features 102C and the active features. For example, the outer contours of the calibration reference features 102C, the first active features 102A, and the second active features 102B may all be parallelograms, as shown in FIG. 1A.

Referring to FIG. 1A, in some embodiments, a spacing E1 between the calibration reference features 102C and the columns of first active features G1 is equal to a spacing E2 between the calibration reference features 102C and the columns of second active features G2. In some embodiments, two adjacent columns of the first active features 102A have the same spacing D3 and two adjacent columns of the second active features 102B have the same spacing D4. In other embodiments, the spacing D3 is equal to the spacing D4. In some embodiments, a spacing D5 of two adjacent first active features 102A of each of the columns of first active features G1 is equal to a spacing D6 of two adjacent second active features 102B of each of the columns of second active features G2. In some embodiments, a spacing D7 of two adjacent calibration reference features 102C is not equal to the spacing D5 and is not equal to the spacing D6.

FIGS. 2A, 3A, 4A, 5A, 6A, 7A, 8A, 9, and 10 illustrate top views of a process for forming the semiconductor structure 10. FIGS. 2A-1, 3A-1, 4A-1, 5A-1, 6A-1, 7A-1, and 8A-1 illustrate cross-sectional views of a semiconductor structure along the line A-A' of FIGS. 2A, 3A, 4A, 5A, 6A, 7A, and 8A, respectively. FIGS. 2A-2, 3A-2, 4A-2, 5A-2, 6A-2, 7A-2, and 8A-2 illustrate cross-sectional views of a semiconductor structure along the line B-B' of FIGS. 2A 3A, 4A, 5A, 6A, 7A, and 8A, respectively. Referring to FIGS. 2A-1 and 2A-2, a substrate 100 is provided with an active layer 102 thereon. In some embodiments, the active layer 102 is a portion of the substrate 100, so that the active layer 102 includes the same material as the substrate 100. In one embodiment, the material of the active layer 102 includes silicon.

Next, a mask layer stack 104 is formed on the active layer 102. In some embodiments, the mask layer stack 104 is a stack of multiple layers, and the material of the multiple layers may each include oxides (e.g., oxide of tetraethyl orthosilicate (TEOS)), nitrides (e.g., silicon nitride), oxynitrides (e.g., silicon oxynitride (SiON)), polycrystalline silicon, amorphous silicon, carbon containing masking materials, or a combination thereof. In some embodiments, the mask layer stack 104 includes a first mask layer 104A, a second mask layer 104B on top of the first mask layer 104A, and a third mask layer 104C on top of the second mask layer 104B, and the first mask layer 104A, the second mask layer 104B, and the third mask layer 104C may include different materials. In such embodiments, the material of the first mask layer 104A may include oxide of tetraethyl orthosilicate (TEOS), the material of the second mask layer 104B may include polycrystalline silicon (polysilicon) or amorphous silicon, and the material of the third mask layer 104C may include a hard mask material containing carbon. In other embodiments, the mask layer stack 104 is a single-layer structure, such as a polycrystalline silicon layer, an amorphous silicon layer, or a single-layer structure of the materials described above.

Thereafter, a sacrificial layer 106 is formed on the mask layer stack 104. The material of the sacrificial layer 106 may include oxynitrides (e.g., silicon oxynitride (SiON)), nitride, polycrystalline silicon, amorphous silicon, carbide, or a combination thereof. In some embodiments, the sacrificial layer 106 is a multi-layer structure, including a first sacrificial material layer 106A and a second sacrificial material layer 106B on top of the first sacrificial material layer 106A. In such embodiments, the material of the first sacrificial material layer 106A may include silicon oxynitride (SiON), and the material of the second sacrificial material layer 106B is different from the first sacrificial material layer 106A and may include polycrystalline silicon or amorphous silicon. In other embodiments, the sacrificial layer 106 is a single layer structure.

Referring to FIGS. 2A, 2A-1, and 2A-2, a patterned photoresist layer 108 is formed on the sacrificial layer 106. The patterned photoresist layer 108 has a rail-shaped profile. In particular, the patterned photoresist layer 108 includes a plurality of strips 108A, and a plurality of connecting features 108B between adjacent strips 108A. The connecting features 108B connect two adjacent strips 108A. The adjacent strips 108A and the connecting features 108B define a plurality of openings 109 and the openings 109 expose the sacrificial layer 106. According to some embodiments, the patterned photoresist layer 108 includes a photoresist layer, an anti-reflective layer (e.g., organic dielectric layer (ODL)), or a combination thereof.

Referring to FIGS. 3A, 3A-1 and 3A-2, a spacer layer 110' is formed on the patterned photoresist layer 108 and on the sacrificial layer 106. The material of the spacer layer 110' may include oxide, nitride, oxynitride, carbide, or a combination thereof. In some embodiments, the spacer layer 110' is conformally formed on the patterned photoresist layer 108 and the sacrificial layer 106.

Referring to FIGS. 4A, 4A-1, and 4A-2, etching back the spacer layer 110' to expose the top surface of the patterned photoresist layer 108 and the top surface of the sacrificial layer 106. In some embodiments, the etching process includes reactive ion etching (RIE), neutral beam etching (NBE), or inductive coupled plasma etching (ICPE).

Referring to FIGS. 5A, 5A-1 and 5A-2, the patterned photoresist layer 108 is removed. The remaining spacer layer 110' forms a patterned spacer 110. The patterned spacer 110 includes a calibration reference pattern P1 and an active region pre-pattern P2. The calibration reference pattern P1 includes a plurality of ring shapes.

Referring to FIGS. 6A, 6A-1, 6A-2, 7A, 7A-1, and 7A-2, a first patterning process is then performed to transfer the calibration reference pattern P1 and the active region pre-pattern P2 of the patterned spacer 110 to the mask layer stack 104. As shown in FIGS. 6A, 6A-1, and 6A-2, the patterned spacer 110 is used as a mask to etch the sacrificial layer 106, and then the patterned spacer 110 is removed. In the embodiments where the sacrificial layer 106 includes the first sacrificial material layer 106A and the second sacrificial material layer 106B, the first sacrificial material layer 106A may be utilized as an etch stop layer, and the etching process of the sacrificial layer 106 is etched through the second sacrificial material layer 106B but not through the first sacrificial material layer 106A. In such embodiments, the first sacrificial material layer 106A may be utilized as the etch stop layer. In the embodiments where the sacrificial layer 106 is a single layer structure, the etching process of the sacrificial layer 106 is etched through the sacrificial layer 106 and the mask layer stack 104 therebelow may be utilized as the etch stop layer. Processes for etching the sacrificial layer 106 may include wet etching, dry etching (e.g., reactive ion etching (RIE), neutral beam etching (NBE), inductive coupled plasma etching (ICPE), or other suitable etching processes).

Figures 1, 7A:
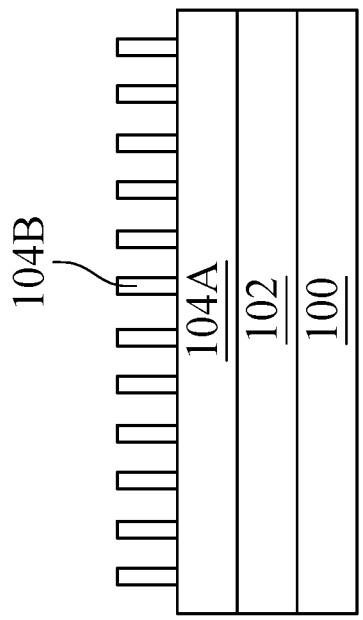
Figures 2, 7A:
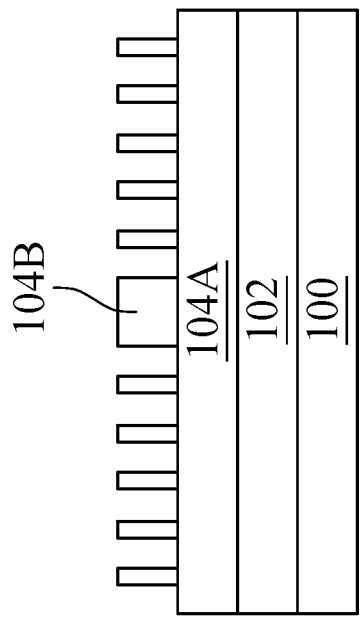
Figure 7A:
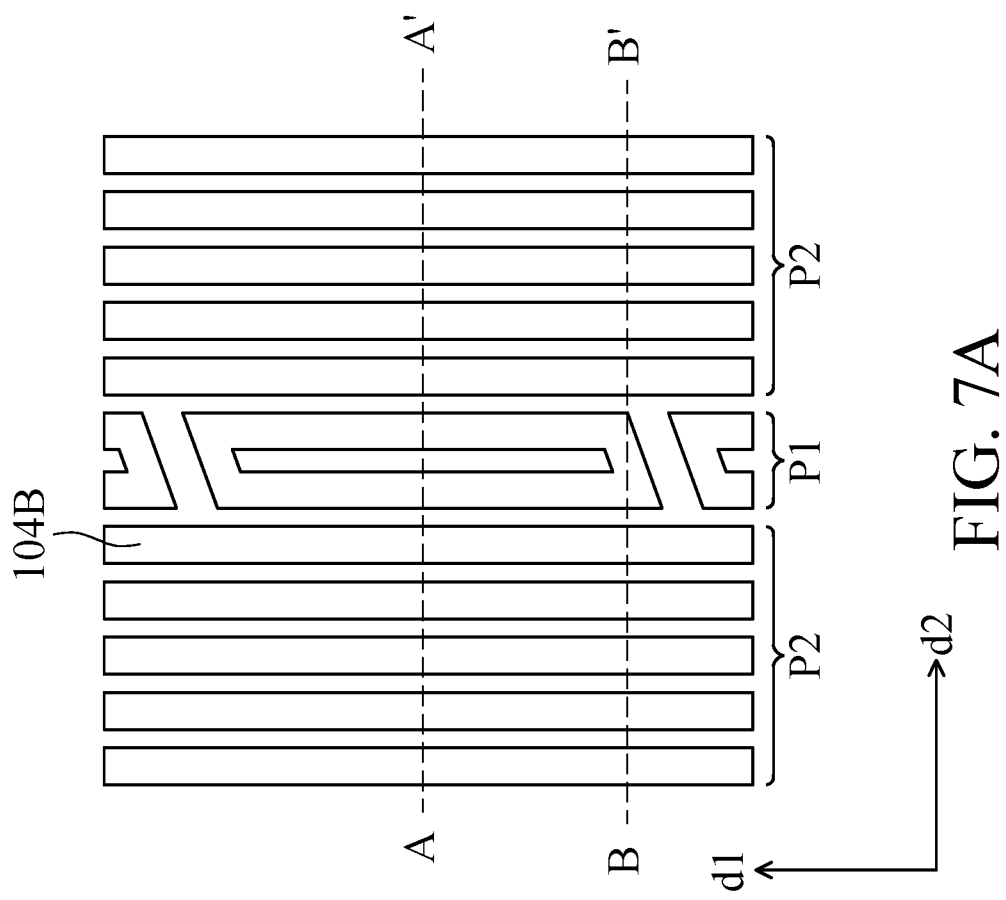
Figures 1, 8A:
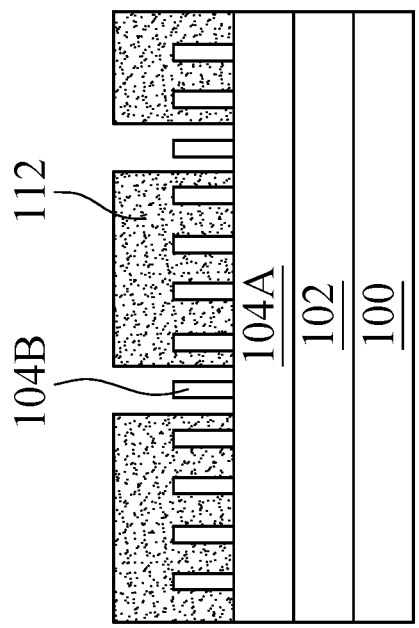
Figures 2, 8A:
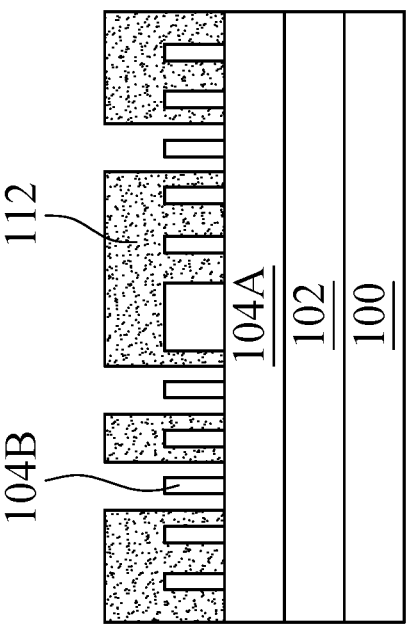
Figure 8A:
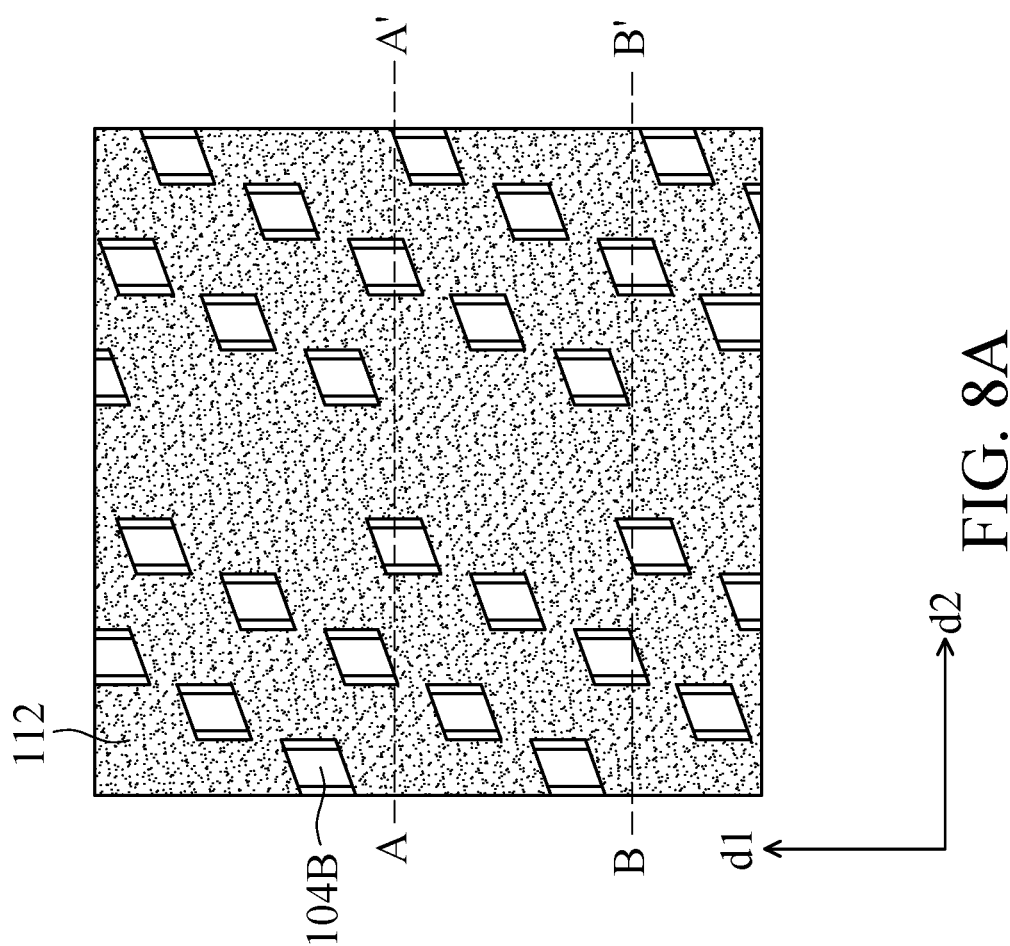

As shown in FIGS. 7A, 7A-1, and 7A-2, the sacrificial layer 106 is used as an etching mask, etching through the first sacrificial material layer 106A (if existed, i.e., if the sacrificial layer 106 is a multi-layer structure), the third mask layer 104C, and the second mask layer 104B, the sacrificial layer 106 and the third mask layer 104C are removed after the etching process, thereby transferring the calibration reference pattern P1 and the active region pre-pattern P2 of the patterned spacer 110 to the mask layer stack 104 (e.g., to the second mask layer 104B). The first mask layer 104A may serve as the etch stop layer and may protect the active layer underneath from damage caused by the etching process. In some embodiments, the process used to etch the mask layer stack 104 may be the same or similar to the etching process described above. In other embodiments, the patterned spacer 110 is used as the mask for the first patterning process, etching the sacrificial layer 106 and the mask layer stack 104 to transfer the calibration reference pattern P1 and the active region pre-pattern P2 of the patterned spacer 110 to the mask layer stack 104, the patterned spacer 110 and the sacrificial layer 106 are removed after the etching process.

Referring to FIGS. 8A, 8A-1, 8A-2, and 9, after performing the first patterning process, a second patterning process is performed to form a patterned photoresist layer 112 on the second mask layer 104B with the calibration reference pattern P1 and expose a portion of the second mask layer 104B.

Figure 9:
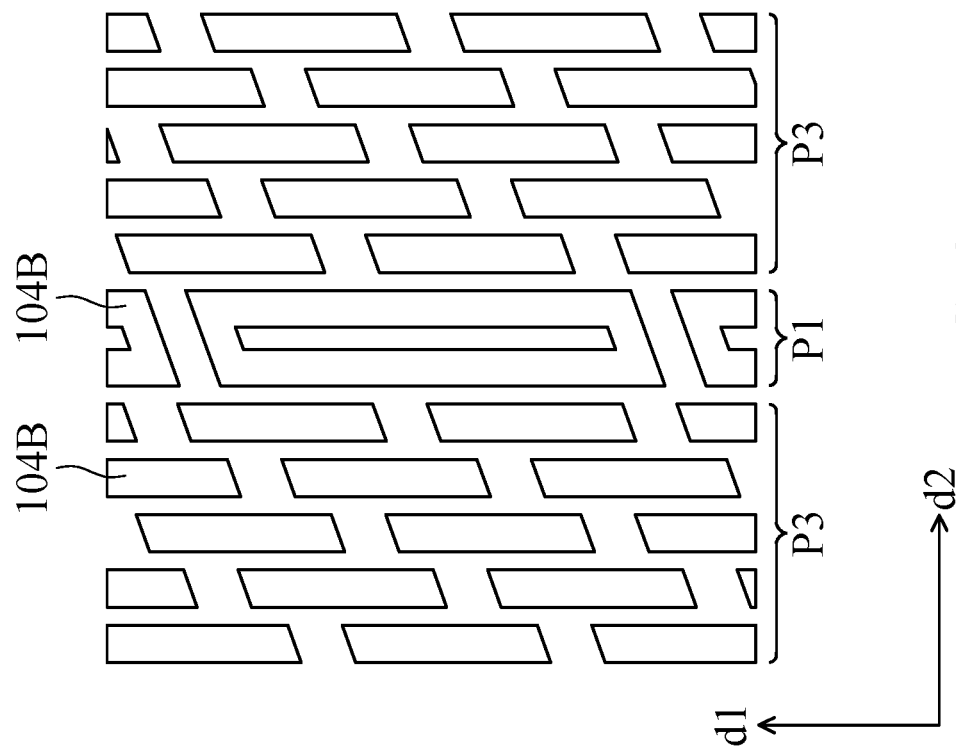

Referring to FIG. 9, the exposed portion of the second mask layer 104B is then removed to pattern the second mask layer 104B with the active region pre-pattern P2 into an active region pattern P3, and subsequently the patterned photoresist layer 112 is removed. Performing the second patterning process is to cut the mask layer stack 104 with the active region pre-pattern P2 into the active region pattern P3 with a plurality of portions spaced apart from each other in the first direction d1. In such embodiments, the patterned photoresist layer 112 may be changed to adjust the shape of the exposed portion of the second mask layer 104B to achieve the desired active region pattern P3. In some embodiments, during the removal of the exposed portion of the second mask layer 104B, the second mask layer 104B with the calibration reference pattern P1 may be protected from the removal process due to the patterned photoresist layer 112 is on the second mask layer 104B with the calibration reference pattern P1. Therefore, the calibration reference pattern P1 defined before the second patterning process (e.g., by the patterned spacer and/or the first patterning process) may be well retained in the second mask layer 104B. After performing the second patterning process, the second mask layer 104B has the calibration reference pattern P1 and the active region pattern P3. In other embodiments, for example, where the mask layer stack 104 is a single layer structure, the calibration reference pattern P1 and the active region pattern P3 may be transferred to the single layer structure of the mask layer stack 104, and the active layer 102 is below the mask layer stack 104.

Figure 10:
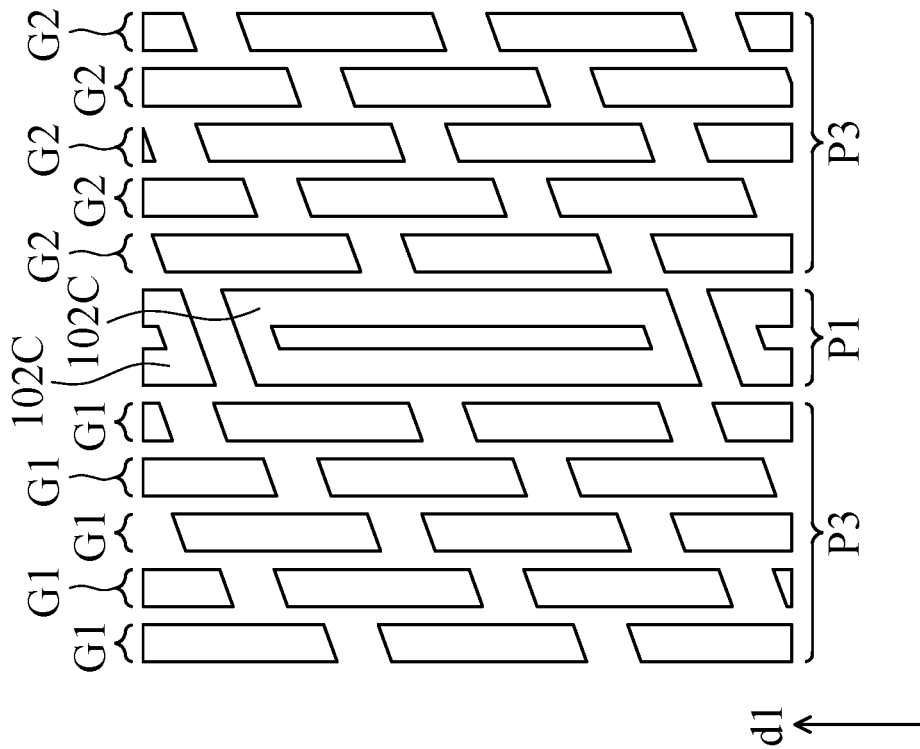

Referring to FIG. 10, after performing the second patterning process, a third patterning process is performed to transfer the calibration reference pattern P1 and the active region pattern P3 of the mask layer stack 104 to the active layer 102, so as to form a plurality of calibration reference features 102C and a plurality of columns of active features G1 and G2, respectively, and the mask layer stack 104 is subsequently removed. The semiconductor structure 10 includes a calibration reference feature 102C with a calibration reference pattern P1 defined before the second patterning process (e.g., by the patterned spacer and/or the first patterning process), and a plurality of columns of active features G1 and G2 with the active region pattern P3 defined in the second patterning process. By measuring the offsets of the calibration reference feature 102C and the columns of active features G1 and G2 and comparing them with the predefined offset value (the ideal state offsets value is 0), it is possible to determine whether there are any offsets between the second patterning process and the process before the second patterning process (e.g., the process that forms the patterned spacer and/or the first patterning process). For example, if the measured offsets of the calibration reference feature 102C and the columns of active features G1 and G2 are equal to 0, there are no offsets between the processes; if the measured offsets of the calibration reference feature 102C and the columns of active features G1 and G2 are not equal to 0, there may be offsets between the processes and the positions of the columns of active features G1 and G2 may be deviated. In some embodiments, the process parameters of the first patterning process and/or the second patterning process may be optimized based on the measured offsets, thereby improving the reliability and/or process margins of the device. In some embodiments, the semiconductor structure 10 may be integrated into a semiconductor device, for example, integrate the calibration reference feature 102C, the columns of active features G1 and G2, and their processes (including, for example, the second patterning process) with the active region of the semiconductor device and its processes, and then measure the offsets of the calibration reference feature 102C and the columns of active features G1 and G2 after forming the features, thereby determining whether the columns of active features G1 and G2 and the active region are deviated, and optimizing the process based on the offsets to improve the reliability and/or performance of the device.

Figure 12:
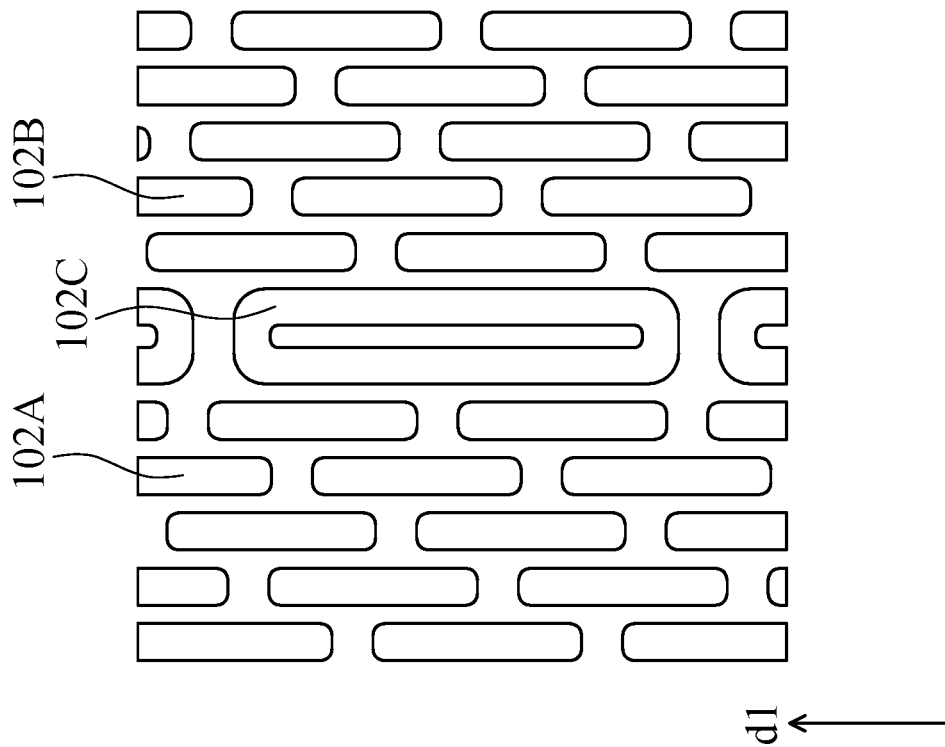
FIGS. 11 and 12 illustrate top views of a semiconductor structure according to other embodiments of the present disclosure.
Figure 11:
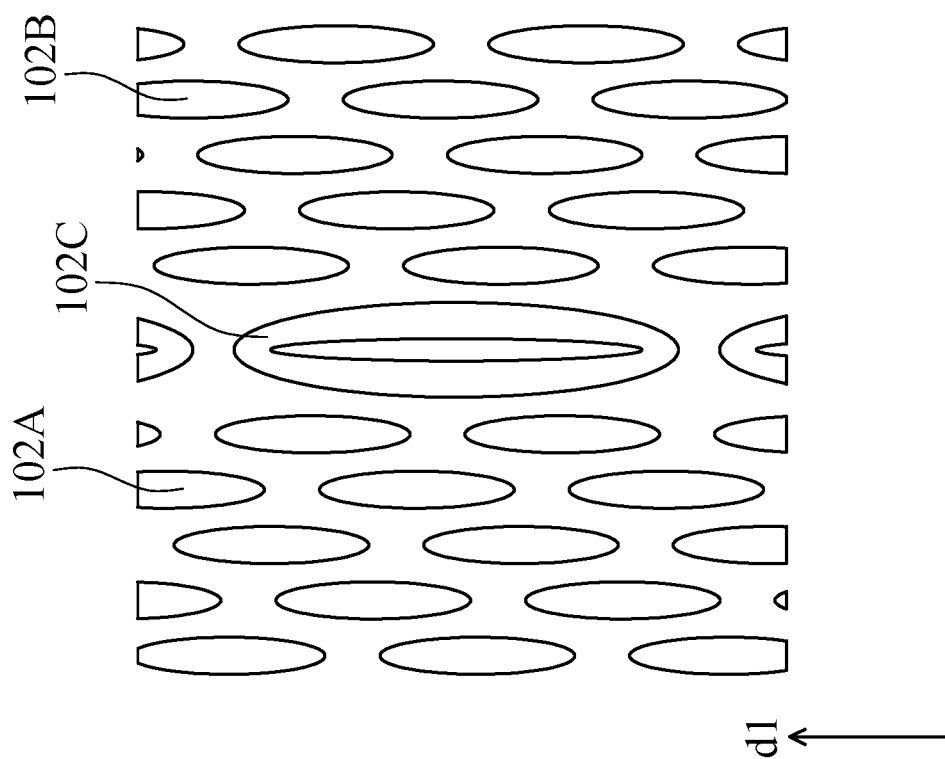

In some embodiments, the outer contours of the calibration reference pattern P1 and the active region pattern P3 have the same or similar shape, e.g., may have parallelogram outer contours, elliptical outer contours, or rounded rectangular outer contours. For example, in the embodiments shown in FIG. 11, the shape of the outer contours of the first active feature 102A, the second active feature 102B, and the calibration reference feature 102C are all elliptical. In the embodiments shown in FIG. 12, the shape of the outer contours of the first active feature 102A, the second active feature 102B, and the calibration reference feature 102C are all rounded rectangular.

Some embodiments of the present disclosure provide semiconductor structures with calibration reference features and methods for forming the same, wherein the calibration reference features may be used to measure the inter-process offsets to improve the reliability and/or process margins of the device. In some embodiments, the measured offsets may be used to determine whether there are any offsets in the active features, in order to further optimize the process, thereby improving the reliability and/or process margins of the device. In addition, the embodiments of the present disclosure provide the semiconductor structures, which may be integrated into a semiconductor device to improve the reliability and/or performance of the device by using the measured offsets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a plurality of calibration reference features disposed on a substrate and spaced apart from each other in a first direction; and
a plurality of columns of first active features and a plurality of columns of second active features respectively disposed on opposite sides of the calibration reference features,
wherein each of the columns of first active features is spaced apart from each other in a second direction, and each of the columns of first active features comprises a plurality of first active features spaced apart from each other in the first direction, the first direction is not parallel to the second direction,
wherein each of the columns of second active features is spaced apart from each other in the second direction, and each of the columns of second active features comprises a plurality of second active features spaced apart from each other in the first direction,
wherein the calibration reference features, the first active features, and the second active features are disposed on a same layer and are a portion of the substrate,
wherein a width of the calibration reference features is greater than a width of the first active features and is greater than a width of the second active features, and a length of the calibration reference features is greater than a length of the first active features and is greater than a length of the second active features.

2. The semiconductor structure as claimed in claim 1, wherein the width of the calibration reference features is at least twice the width of the first active features and is at least twice the width of the second active features.

3. The semiconductor structure as claimed in claim 1, wherein the length of the calibration reference features is at least twice the length of the first active features and is at least twice the length of the second active features.

4. The semiconductor structure as claimed in claim 1, wherein two adjacent columns of the first active features are disposed alternating with each other and two adjacent columns of the second active features are disposed alternating with each other, wherein a spacing of two adjacent first active features of each of the columns of first active features is equal to a spacing of two adjacent second active features of each of the columns of second active features.

5. The semiconductor structure as claimed in claim 1, wherein outer contours of the calibration reference features, the first active features, and the second active features comprise a same shape.

6. The semiconductor structure as claimed in claim 5, wherein the shape of the outer contours comprise parallelogram, ellipse or rounded rectangular shape.

7. The semiconductor structure as claimed in claim 1, wherein the calibration reference features comprise a ring shape.

8. The semiconductor structure as claimed in claim 7, wherein a width of one side of the ring shape is equal to the width of the first active features and equal to the width of the second active features.

9. The semiconductor structure as claimed in claim 1, wherein a spacing of the calibration reference features and the columns of first active features is equal to a spacing of the calibration reference features and the columns of second active features.

10. The semiconductor structure as claimed in claim 1, wherein longitudinal lengths of the calibration reference features, the first active features, and the second active features are along the first direction.

11. The semiconductor structure as claimed in claim 4, wherein a spacing of two adjacent calibration reference features is not equal to the spacing of two adjacent first active features of each of the columns of first active features and is not equal to the spacing of two adjacent second active features of each of the columns of second active features.

12. A method for forming the semiconductor structure of claim 1, comprising:
    providing the substrate with an active layer thereon, wherein the active layer is a portion of the substrate;
    forming a mask layer stack on the active layer;
    forming a sacrificial layer on the mask layer stack;
    forming a patterned spacer on the sacrificial layer, the patterned spacer comprising a calibration reference pattern and an active region pre-pattern;
    performing a first patterning process to transfer the calibration reference pattern and the active region pre-pattern of the patterned spacer to the mask layer stack;
    after performing the first patterning process, performing a second patterning process to pattern the mask layer stack with the active region pre-pattern into an active region pattern; and
    after performing the second patterning process, performing a third patterning process to transfer the calibration reference pattern and the active region pattern of the mask layer stack to the active layer to respectively form the plurality of calibration reference features and a plurality of columns of active features.

13. The method as claimed in claim 12, wherein the calibration reference features are spaced apart from each other in a direction, the columns of active features comprising the plurality of columns of first active features and the plurality of columns of second active features respectively disposed at the opposite sides of the calibration reference features.

14. The method as claimed in claim 12, wherein forming the patterned spacer on the sacrificial layer comprises:
    forming a patterned photoresist layer on the sacrificial layer, wherein the patterned photoresist layer comprises a plurality of strips and a plurality of connecting features between adjacent ones of the strips, wherein the adjacent ones of the strips and the connecting features define a plurality of openings and expose the sacrificial layer;
    forming a spacer layer on the patterned photoresist layer and the sacrificial layer;
    etching the spacer layer to expose a top surface of the patterned photoresist layer and a top surface of the sacrificial layer; and removing the patterned photoresist layer.

15. The method as claimed in claim 12, wherein performing the first patterning process comprises:
    using the patterned spacer as a mask to etch the sacrificial layer;
    removing the patterned spacer; and
    using the sacrificial layer as the mask to etch the mask layer stack.

16. The method as claimed in claim 12, wherein performing the second patterning process comprises:
    forming a patterned photoresist layer on the mask layer stack with the calibration reference pattern and exposing a portion of the mask layer stack; and
    removing the exposed portion of the mask layer stack.

17. The method as claimed in claim 12, wherein the mask layer stack is a multi-layer structure, and a material of the mask layer stack comprises oxide of tetraethyl orthosilicate (TEOS), silicon nitride, silicon oxynitride, polycrystalline silicon, amorphous silicon, carbon containing masking materials, or a combination thereof.

18. The method as claimed in claim 12, wherein outer contours of the calibration reference pattern and the active region pattern comprise a same shape.

19. The method as claimed in claim 12, wherein the width of the calibration reference features is greater than a width of the columns of active features.

20. The method as claimed in claim 12, wherein the calibration reference pattern comprises a plurality of ring shapes.

* * * * *